(12) United States Patent
Huang et al.

(10) Patent No.: US 10,566,556 B2
(45) Date of Patent: Feb. 18, 2020

(54) SWITCHABLE DISPLAY PANEL, METHOD FOR FABRICATING THE SAME, AND SWITCHABLE DISPLAY DEVICE

(71) Applicant: BOE TECHNOLOGY GROUP CO., LTD., Beijing (CN)

(72) Inventors: Wei Huang, Beijing (CN); Dawei Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 76 days.

(21) Appl. No.: 15/547,372

(22) PCT Filed: Mar. 25, 2016

(86) PCT No.: PCT/CN2016/077330
§ 371 (c)(1),
(2) Date: Jul. 28, 2017

(87) PCT Pub. No.: WO2016/197664
PCT Pub. Date: Dec. 15, 2016

(65) Prior Publication Data
US 2018/0040839 A1  Feb. 8, 2018
US 2018/0261782 A9  Sep. 13, 2018

(30) Foreign Application Priority Data

Jun. 9, 2015  (CN) .......................... 2015 1 0314277

(51) Int. Cl.
*H01L 29/08*  (2006.01)
*H01L 51/05*  (2006.01)
(Continued)

(52) U.S. Cl.
CPC ........ *H01L 51/0591* (2013.01); *G02F 1/1333* (2013.01); *G09G 3/3258* (2013.01);
(Continued)

(58) Field of Classification Search
CPC ........ H01L 51/0591; G09G 5/00; G09G 3/36; G06F 3/14
(Continued)

(56) References Cited

U.S. PATENT DOCUMENTS

2013/0314633 A1* 11/2013 Koo .................... H01L 51/5203
349/41
2015/0138214 A1* 5/2015 Roh .................... G02B 27/0101
345/520

FOREIGN PATENT DOCUMENTS

CN  1434334 A   8/2003
CN  1714380 A  12/2005
(Continued)

OTHER PUBLICATIONS

PCT International Search Report, Application No. PCT/CN2016/077330, dated Jun. 29, 2016, 6 pages.: with English translation.
(Continued)

*Primary Examiner* — Caleb E Henry
(74) *Attorney, Agent, or Firm* — Armstrong Teasdale LLP

(57) ABSTRACT

A display panel, a method for fabricating the same and a display device are disclosed. The display panel includes a top emission AMOLED display sub-panel, a normally-white mode reflective display sub-panel provided on the top emission AMOLED display sub-panel, and a switching element configured to turn on the top emission AMOLED display sub-panel and turn off the normally-white mode reflective display sub-panel according to a received first instruction, and turn on the normally-white mode reflective display sub-panel and turn off the top emission AMOLED display sub-panel according to a received second instruction. By fabricating the normally-white mode reflective display sub-panel on the top emission AMOLED display sub-panel, it is possible to switch, on one operation interface, to the normally-white mode reflective sub-panel to achieve a good (Continued)

display effect under strong light, or to the top emission AMOLED display sub-panel to achieve viewing color content. The display panel and the corresponding display device are easy to operate and simple in structure.

9 Claims, 5 Drawing Sheets

(51) Int. Cl.
    *G02F 1/1333* (2006.01)
    *H01L 27/32* (2006.01)
    *H01L 51/56* (2006.01)
    *G09G 3/3258* (2016.01)
    *H01L 51/00* (2006.01)
    *H01L 51/52* (2006.01)

(52) U.S. Cl.
    CPC ...... *H01L 27/3248* (2013.01); *H01L 27/3267* (2013.01); *H01L 51/0008* (2013.01); *H01L 51/5203* (2013.01); *H01L 51/56* (2013.01); *G02F 2201/44* (2013.01); *H01L 2251/5315* (2013.01)

(58) Field of Classification Search
    USPC .......................................................... 257/40
    See application file for complete search history.

(56) References Cited

FOREIGN PATENT DOCUMENTS

| | | |
|---|---|---|
| CN | 101110441 A | 1/2008 |
| CN | 102930787 A | 2/2013 |
| CN | 102998845 A | 3/2013 |
| CN | 103187020 A | 7/2013 |
| CN | 103337510 A | 10/2013 |
| CN | 104020602 A | 9/2014 |
| CN | 104347680 A | 2/2015 |
| CN | 104391406 A | 3/2015 |
| CN | 104867416 A | 8/2015 |
| CN | 105745697 A | 7/2016 |
| JP | 200438145 A | 2/2004 |
| TW | 201118823 A1 | 6/2011 |

OTHER PUBLICATIONS

PCT Written Opinion, Application No. PCT/CN2016/077330, dated Jun. 29, 2016, 7 pages.: with English translation.
China First Office Action, Application No. 201510314277.6, dated Dec. 16, 2016, 28 pps.: with English translation.
China Second Office Action, Application No. 201510314277.6, dated Jun. 5, 2017, 28 pps.: with English translation.
China Third Office Action, Application No. 201510314277.6, dated Sep. 28, 2017, 31 pps.: with English translation.

* cited by examiner

SWITCHABLE DISPLAY PANEL, METHOD FOR FABRICATING THE SAME, AND SWITCHABLE DISPLAY DEVICE

CROSS REFERENCE TO RELATED APPLICATIONS

This patent application is a National Stage Entry of PCT/CN2016/077330 filed on Mar. 25, 2016, which claims priority of Chinese Patent Application No. 201510314277.6, filed on Jun. 9, 2015, the of which are incorporated herein in their entirety as part of the present application.

BACKGROUND

Exemplary embodiments of the present disclosure relate to a display panel, a method for fabricating the same, and a display device.

In recent years, with the popularity of smart phones, tablet PCs and other mobile terminals, display screens with smaller sizes have been widely used, mainly concentrated in active matrix organic light emitting diode (AMOLED) display, low-temperature poly-silicon (LTPS) LCD display, high-resolution amorphous silicon (a-Si) LCD display, and the like. People's living habits also have changed greatly with the popularity of mobile terminals like smart phones, and the use thereof for a long time results in eye fatigue and physical discomfort, especially improper reading in outdoor conditions. Although there are display products like eye-protected reflective electronic paper in the market, such display product like electronic paper cannot achieve color display, resulting in poor video/web view effect, greatly limiting the market thereof.

In view of the above habitual conflict, some manufacturers have proposed dual-mode display products enabling both color display and black/white display. For example, a YotaPhone 2 smart phone has a 5-inch Super AMOLED full HD screen on one side and a 4.7-inch reflective electronic paper screen with a resolution ratio of 960×540 on the other side. Such structure needs to turn over the display when the two screens are being viewed, which is complex in operation, easily damaging the other side when viewing one side.

BRIEF DESCRIPTION

The present disclosure aims to provide a display panel, a method for fabricating the same, and a display device, so as to achieve both reflective display and color display on the same side of the display device.

According to a first aspect of the present disclosure, there is provided a display panel including, a top emission AMOLED display sub-panel, a normally-white mode reflective display sub-panel provided on the top emission AMOLED display sub-panel, and a switching element configured to turn on the top emission AMOLED display sub-panel and turn off the normally-white mode reflective display sub-panel according to a received first instruction, and turn on the normally-white mode reflective display sub-panel and turn off the top emission AMOLED display sub-panel according to a received second instruction.

According to an embodiment of the present disclosure, the top emission AMOLED display sub-panel includes a first reflective electrode.

According to an embodiment of the present disclosure, the top emission AMOLED display sub-panel further includes, a first substrate on which the first reflective electrode is provided, an organic light emitting layer being provided on the first reflective electrode, a second electrode provided on the organic light emitting layer, and a package layer provided on the second electrode.

According to an embodiment of the present disclosure, a thickness of the organic light emitting layer is smaller than a predetermined thickness.

According to an embodiment of the present disclosure, the normally-white mode reflective display sub-panel includes a polarizing plate.

According to an embodiment of the present disclosure, the normally-white mode reflective display sub-panel further includes a second substrate provided on the package layer, a thin film transistor provided on the second substrate, a liquid crystal layer provided on the thin film transistor, wherein the polarizing plate is provided on the liquid crystal layer.

According to an embodiment of the present disclosure, a phase delay of the second substrate is smaller than a preset value.

According to an embodiment of the present disclosure, the display panel further an adhesive layer provided between the second substrate and the package layer.

According to an embodiment of the present disclosure, the display panel further a touch sub-panel provided below the top emission AMOLED display sub-panel or provided above the normally-white mode reflective display sub-panel, wherein, if the touch sub-panel is provided below the top emission AMOLED display sub-panel, the normally-white mode reflective display sub-panel further includes a third substrate provided on the polarizing plate, and a protective layer provided on the third substrate.

According to an embodiment of the present disclosure, the normally-white mode reflective display sub-panel further includes, a flat layer provided between the second substrate and the thin film transistor.

According to an embodiment of the present disclosure, the normally-white mode reflective display sub-panel further includes a barrier layer provided below the second substrate.

According to an embodiment of the present disclosure, a sum of the thicknesses of the flat layer, the second substrate, the barrier layer, the package layer, the second electrode and the organic light emitting layer is between 35 and 60 micrometers (μm).

According to an embodiment of the present disclosure, the normally-white mode reflective display sub-panel further includes a color film layer provided between the liquid crystal layer and the polarizing plate.

According to a second aspect of the present disclosure, there is further provided a display device including a display panel according to any one of the above.

According to a third aspect of the present disclosure, there is further provided a method for fabricating a display panel. The method includes forming a top emission AMOLED display sub-panel, and forming a normally-white mode reflective display sub-panel on the top emission AMOLED display sub-panel, wherein the top emission AMOLED display sub-panel is turned on by a switching element when receiving a first instruction and is turned off by the switching element when receiving a second instruction, and the normally-white mode reflective display sub-panel is turned off by the switching element when receiving the first instruction, and is turned on by the switching element when receiving the second instruction.

According to an embodiment of the present disclosure, forming the top emission AMOLED display sub-panel includes forming a first reflective electrode.

According to an embodiment of the present disclosure, forming the top emission AMOLED display sub-panel further includes forming a first substrate before forming the first reflective electrode, wherein the first reflective electrode is provided on the first substrate, forming an organic light emitting layer on the first reflective electrode, forming a second electrode on the organic light emitting layer, and forming a package layer on the second electrode.

According to an embodiment of the present disclosure, forming the normally-white mode reflective display sub-panel on the top emission AMOLED display sub-panel includes forming a polarizing plate.

According to an embodiment of the present disclosure, forming the normally-white mode reflective display sub-panel on the top emission AMOLED display sub-panel further includes forming a second substrate on the package layer, forming a thin film transistor on the second substrate, and forming a liquid crystal layer on the thin film transistor, wherein the polarizing plate is formed after the liquid crystal layer is formed.

According to an embodiment of the present disclosure, forming the normally-white mode reflective display sub-panel on the top emission AMOLED display sub-panel further includes forming an orientation layer on both sides of the liquid crystal layer by mechanical friction or light irradiation.

According to an embodiment of the present disclosure, forming the thin film transistor includes forming the thin film transistor in the temperature below 200° C.

According to an embodiment of the present disclosure, the method for fabricating the display panel further includes forming an adhesive layer on the package layer before forming the second substrate.

According to an embodiment of the present disclosure, the method for fabricating the display panel further includes forming a touch sub-panel before forming the top emission AMOLED display sub-panel or forming a touch sub-panel after forming the normally-white mode reflective display sub-panel, wherein if the touch sub-panel is formed before the top emission AMOLED display sub-panel is formed, forming the normally-white mode reflective display sub-panel further includes forming a third substrate on the polarizing plate, and forming a protective layer on the third substrate.

According to an embodiment of the present disclosure, forming the normally-white mode reflective display sub-panel before forming the thin film transistor further includes forming a flat layer on the second substrate.

According to an embodiment of the present disclosure, forming the normally-white mode reflective display sub-panel further includes: includes forming a barrier layer on the package layer before forming the second substrate.

According to an embodiment of the present disclosure, a sum of the thicknesses of the flat layer, the second substrate, the barrier layer, the package layer, the second electrode and the organic light emitting layer is between 35 and 60 micrometers (μm).

According to an embodiment of the present disclosure, forming the normally-white mode reflective display sub-panel further includes forming a color film layer between the liquid crystal layer and the polarizing plate.

According to the above-described technical solution, by fabricating the normally-white mode reflective display sub-panel on the top emission AMOLED display sub-panel, it is possible to switch, on one operation interface, to the reflective sub-panel to achieve a good display effect under strong light, or to the top emission AMOLED display sub-panel to achieve viewing color content. The display panel, the method for fabricating the same and the corresponding display device according to the embodiments of the present disclosure are easy to operate and simple in structure.

BRIEF DESCRIPTION OF THE DRAWINGS

In order to more clearly illustrate the technical solutions in the embodiments of the present disclosure or the prior art, the drawings, which are to be used in the description of the embodiments or the prior art, will be briefly described below. It will be apparent that the drawings in the following description are merely some embodiments of the present disclosure, and other drawings may be obtained by those of ordinary skill in the art based on these drawings without creative work.

DETAILED DESCRIPTION

The technical solutions in the embodiments of the present disclosure will now be described clearly and completely below in conjunction with the accompanying drawings in the embodiments of the present disclosure, and it will be apparent that the described embodiments are merely part of the embodiments of the present disclosure instead of all of the embodiments. All other embodiments obtained by those of ordinary skill in the art based on the embodiments in the present disclosure without creative work are within the scope of the present disclosure.

Figure 1:
FIG. 1 shows a schematic structural view of a display panel according to an embodiment of the present disclosure.

As shown in FIG. 1, a display panel according to an embodiment of the present disclosure includes a top emission AMOLED display sub-panel 1, a normally-white mode reflective display sub-panel 2 provided on the top emission AMOLED display sub-panel 1, and a switching element configured to turn on the top emission AMOLED display sub-panel 1 and turn off the normally-white mode reflective display sub-panel 2 according to a received first instruction, and turn on the normally-white mode reflective display sub-panel 2 and turn off the top emission AMOLED display sub-panel 1 according to a received second instruction.

According to the embodiment of the present disclosure, by fabricating the normally-white mode reflective display sub-panel 2 on the top emission AMOLED display sub-panel 1, it is possible to switch the two display sub-panels on one operation interface, so the operation is easy and the structure is simple. Moreover, the use of the normally-white mode reflective display sub-panel 2 needs no backlight source, thereby reducing the display energy consumption. Since light with high-energy and strong-penetrability is substantially not reflected, and a large amount of light with high-energy strong-penetrability is filtered out after light is reflected, the reflected light has very few damages on eyes, with an eye protection effect.

For example, in the environment where the outdoor light is strong, the normally-white mode reflective display sub-panel 2 may be turned on to display the content, and the top emission AMOLED display sub-panel 1 may be turned off. While in the environment where the indoor light is weak, the top emission AMOLED display sub-panel 1 may be turned on to display the color content and the normally-white mode reflective display sub-panel 2 may be turned off. The display panel according to the embodiment of the present disclosure facilitates the user's selection of the display sub-panel as desired, thereby making the viewing mode more flexible and the operation of switching the display sub-panels more convenient.

Figure 2:
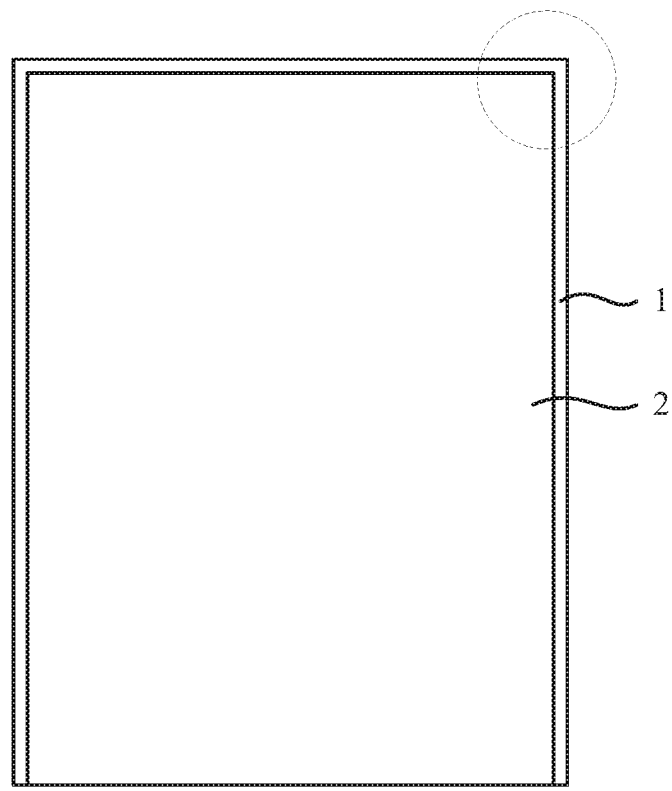
FIG. 2 shows a top view of a display panel according to an embodiment of the present disclosure.
Figure 3:
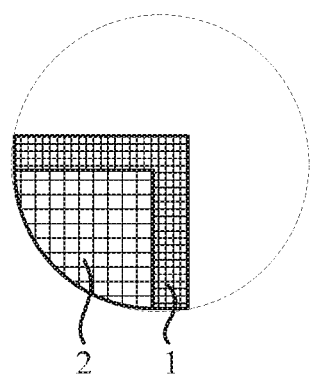
FIG. 3 shows a partial enlarged view of a dotted line portion in FIG. 2.

As shown in FIGS. 2 and 3, the normally-white mode reflective display sub-panel 2 is provided on the top emission AMOLED display sub-panel 1, and the area of the normally-white mode reflective display sub-panel 2 can be set slightly smaller than that of the top emission AMOLED display sub-panel 1 so as to enhance the stability of the whole structure.

According to the embodiment of the present disclosure, the resolution of the top emission AMOLED display sub-panel 1 is 300 ppi (the number of pixels per unit area), the resolution of the normally-white mode reflective display sub-panel 2 is between 50 ppi and 150 ppi, and the black matrix in the normally-white mode reflective display sub-panel 2 is wider, for example, the width of the black matrix is between 20 μm and 50 μm (micrometers).

Figure 4:
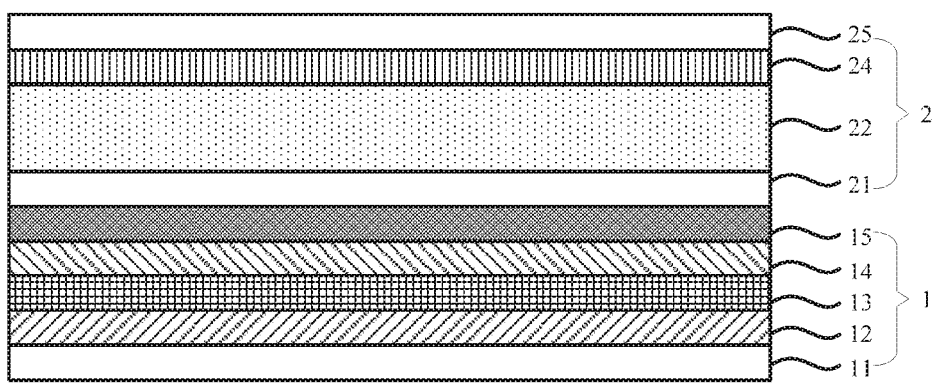
FIG. 4 shows a schematic view of a specific structure of a display panel according to an embodiment of the present disclosure.

As shown in FIG. 4, according to the embodiment of the present disclosure, the top emission AMOLED display sub-panel 1 includes a first reflective electrode 12 configured for driving an organic light emitting layer 13 in the top emission AMOLED display sub-panel 1, and providing reflected light for the normally-white mode reflective display sub-panel 2.

With the first reflective electrode 12 of the top emission AMOLED display sub-panel 1, for example, an anode, to drive the organic light emitting layer 13 in the top emission AMOLED display sub-panel 1 and provide reflected light to the normally-white reflective display sub-panel 2, the provision of a reflective layer in the normally-white mode reflective display sub-panel 2 may be omitted, thereby reducing the layer structures in the display panel, and reducing the thickness of the display panel.

According to an embodiment of the present disclosure, the top emission AMOLED display sub-panel 1 further includes a first substrate 11 on which the first reflective electrode 12 is provided, an organic light emitting layer 13 being provided on the first reflective electrode 12, a second electrode 14 provided on the organic light emitting layer 13, and a package layer 15 provided on the second electrode 14.

According to an embodiment of the present disclosure, a thickness of the organic light emitting layer 13 is smaller than a preset thickness, for example, 3 μm or 1.2 μm (micrometers). According to an embodiment of the present disclosure, the thickness of the organic light emitting layer 13 is between 0.2 μm and 3 μm (micrometers). According to another embodiment of the present disclosure, the thickness of the organic light emitting layer 13 is between 0.8 μm and 1.2 μm (micrometers).

Since the organic light emitting layer 13 is generally weak in light transmission, setting the thickness of the organic light emitting layer 13 to be small may ensure that the organic light emitting layer 13 has a high light transmittance, so that the light incident from the normally-white mode reflective display sub-panel 2 may smoothly reach the first reflective electrode 12 and then is reflected by the first reflective electrode 12, so as to achieve a reflective display of the normally-white mode reflective display sub-panel 2.

As shown in FIG. 4, according to an embodiment of the present disclosure, the normally-white mode reflective display sub-panel 2 includes a polarizing plate 24 configured for blocking or transmitting the light exiting from the top emission AMOLED display sub-panel 1, or for blocking or transmitting the light exiting from the normally-white mode reflective display sub-panel 2.

With the polarizing plate 24 (e.g., a circular polarizing plate) in the normally-white mode reflective display sub-panel 2 which can block or transmit the light exiting from the top emission AMOLED display sub-panel 1 or block or transmit the light exiting from the normally-white mode reflective display sub-panel 2, there is no need to provide a polarizing plate in the top emission AMOLED display sub-panel 1, thereby reducing the layer structures in the display panel and reducing the thickness of the display panel.

According to an embodiment of the present disclosure, the normally-white mode reflective display sub-panel 2 further includes a second substrate 21 provided on the package layer 15 and having a thickness of 5 to 30 μm (micrometers), a thin film transistor (not shown) provided on the second substrate 21, the thin film transistor including a gate, a source, a drain, an active layer, and the like, wherein the gate is provided on the second substrate 21, the gate is provided with a gate insulating layer thereon, the source, the drain and the active layer are provided on the gate insulating layer, and the drain is also connected to a pixel electrode, a liquid crystal layer 22 provided on the thin film transistor, wherein a common electrode may further be provided on the liquid crystal layer 22, an orientation layer may be provided on both sides of the liquid crystal layer, and a material of the orientation layer may be polyimide, wherein the polarizing plate 24 is provided on the liquid crystal layer 22, and in a case that the common electrode is provided on the liquid crystal layer 22, the polarizing plate 24 is provided on the common electrode, and the liquid crystal is deflected when a voltage is applied between the pixel electrode and the common electrode.

According to an embodiment of the present disclosure, the thin film transistor may be a low-temperature-fabricated a-Si TFT, an organic TFT, a low-temperature oxide TFT, or a solution-type semiconductor TFT.

According to an embodiment of the present disclosure, the second substrate 21 may employ a transparent plastic substrate having a relatively high temperature tolerance and a low phase delay. The phase delay of the second substrate 21 is smaller than a preset value, for example, 3000 nm or 2500 nm (nanometers). According to an embodiment of the present disclosure, the phase delay of the second substrate 21 is between 1000 nm and 3000 nm (nanometers). According to another embodiment of the present disclosure, the phase delay of the second substrate 21 is between 1500 nm to 2500 nm (nanometers). Setting the phase delay of the second substrate 21 to be small may reduce the influence on the light passing through the second substrate 21, for example, the second substrate 21 may employ a fiber-reinforce polymer (i.e., FRP).

Figure 5:
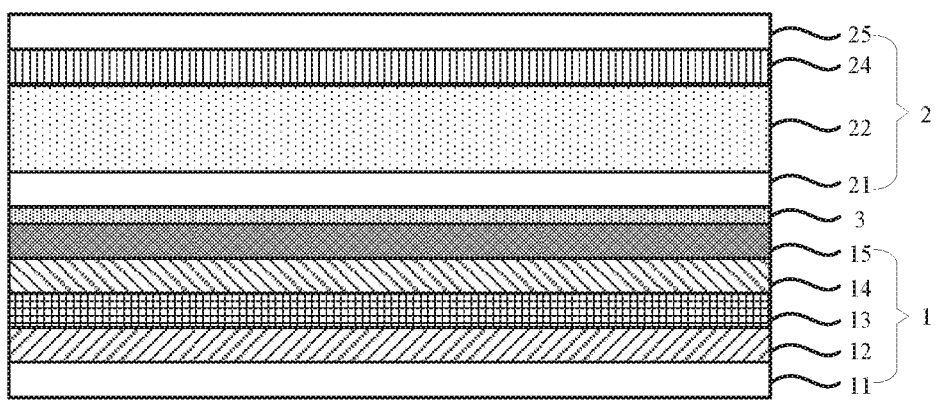
FIG. 5 shows a schematic view of the specific structure of a display panel according to another embodiment of the present disclosure.

As shown in FIG. 5, the display panel according to an embodiment of the present disclosure further includes an adhesive layer 3 provided between the second substrate 21 and the package layer 15, and configured for bonding the second substrate 21 and the package layer 15 to increase the degree of firm bonding between the top emission AMOLED display sub-panel 1 and the normally-white mode reflective display sub-panel 2.

A display panel according to an embodiment of the present disclosure further includes a touch sub-panel (not shown in FIG. 5) provided below the top emission AMOLED display sub-panel 1 or above the normally-white mode reflective display sub-panel 2.

If the touch sub-panel is provided below the top emission AMOLED display sub-panel 1, the normally-white mode reflective display sub-panel 2 further includes a third substrate 25 provided on the polarizing plate 24, and a protective layer (not shown in FIG. 5) provided on the third substrate 25.

In a case where the touch sub-panel is provided above the normally-white mode reflective display sub-panel 2, the touch sub-panel may be located on the outermost side (e.g., the uppermost side) of the display panel, and may serve as an upper substrate and a protective layer of the normally-white mode reflective display sub-panel 2. In a case where the touch sub-panel is provided below the top emission AMOLED display sub-panel 1, the normally-white mode reflective display sub-panel 2 is located on the outermost side (for example, the uppermost side) of the display panel, and it is necessary to provide an upper substrate for the normally-white mode reflective display sub-panel 2 (i.e. the third substrate 25) to sandwich the liquid crystal layer 22, and to provide a corresponding protective layer to avoid damages to the internal structure.

Figure 6:
FIG. 6 shows a schematic view of the specific structures of a flat layer and a barrier layer according to an embodiment of the present disclosure.

As shown in FIG. 6, according to an embodiment of the present disclosure, the normally-white mode reflective display sub-panel 2 further includes a flat layer 26 provided between the second substrate 21 and the thin film transistor. The flat layer 26 may provide a flat environment for the fabricating of thin film transistors in the normally-white mode reflective display sub-panel 2.

According to an embodiment of the present disclosure, the normally-white mode reflective display sub-panel 2 further includes a barrier layer 27 provided below the second substrate 21. The barrier layer 27 may block moisture and oxygen and increase the packaging effect of the top emission AMOLED display sub-panel 1.

According to the embodiment of the present disclosure, a sum of the thicknesses of the flat layer 26, the second substrate 21, the barrier layer 27, the package layer 15, the second electrode 14, and the organic light emitting layer 13 is between 35 and 60 μm (micrometers).

The first reflective electrode 12 serves as the reflective layer of the normally-white mode reflective display sub-panel 2, and in a case that the distance from the liquid crystal layer 22 is large, the light reflected by the first reflective electrode 12 has a large deflection angle, which easily results in light leakage. Setting the sum of the thicknesses of the flat layer 26, the second substrate 21, the barrier layer 27, the package layer 15, the second electrode 14, and the organic light emitting layer 13 to be between 35 and 60 μm (micrometers), may ensure that the light reflected by the first reflective electrode 12 has a small deflection angle after passing through these layers, thereby reducing light leakage.

Figure 7:
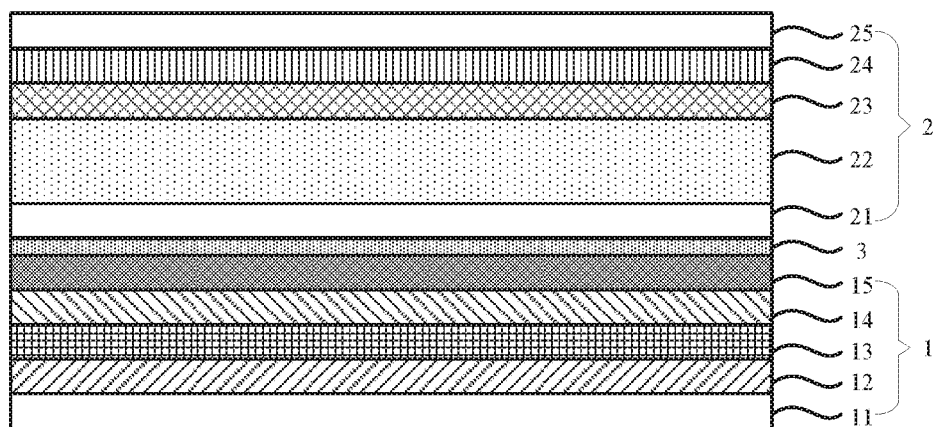
FIG. 7 shows a schematic view of the specific structure of a display panel according to yet another embodiment of the present disclosure.

As shown in FIG. 7, according to an embodiment of the present disclosure, the normally-white mode reflective display sub-panel 2 further includes a color film layer 23 provided between the liquid crystal layer 22 and the polarizing plate 24.

If the normally-white mode reflective display sub-panel 2 is required to achieve a color display, a color film layer 23 may be provided on the liquid crystal layer 22, but it is necessary to set the sum of the thicknesses of the flat layer 26, the second substrate 21, the barrier layer 27, the package layer 15, the second electrode 14, and the organic light emitting layer 13 to be between 35 and 60 μm (micrometers) to ensure that the light reflected by the first reflective electrode 12 has a small deflection angle after passing through these layers, thereby reducing color mixing when the reflected light exits out of the color film layer 23.

The present disclosure further proposes a display device including a display panel according to any of the foregoing.

It should be noted that the display device in the present embodiment may be any product or component having a display function such as an electronic paper, a mobile phone, a tablet computer, a television set, a notebook computer, a digital photo frame, a navigator, or the like.

Figure 8:
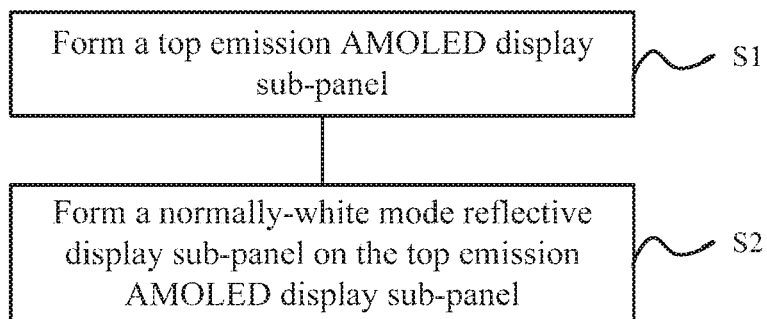
FIG. 8 shows a schematic flow chart of a method for fabricating a display panel according to an embodiment of the present disclosure.

As shown in FIG. 8, the present disclosure also provides a method for fabricating a display panel, which includes S1, forming a top emission AMOLED display sub-panel 1, S2, forming a normally-white mode reflective display sub-panel 2 on the top emission AMOLED display sub-panel 1, wherein the top emission AMOLED display sub-panel 1 is turned on by a switching element when receiving a first instruction and is turned off by the switching element when receiving a second instruction, and the normally-white mode reflective display sub-panel 2 is turned off by the switching element when receiving the first instruction, and is turned on by the switching element when receiving the second instruction.

Figure 9:
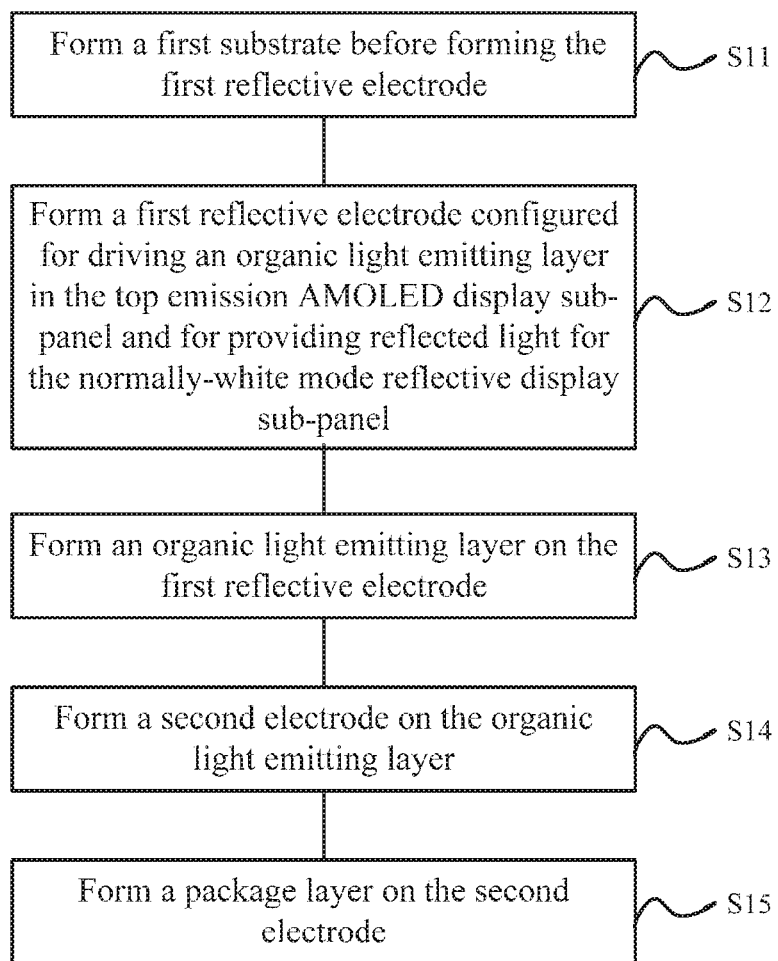
FIG. 9 shows a schematic flow chart of forming a top emission AMOLED display sub-panel according to an embodiment of the present disclosure.

As shown in FIG. 9, according to an embodiment of the present disclosure, forming the top emission AMOLED display sub-panel 1 includes S12, forming a first reflective electrode 12 configured for driving the organic light emitting layer 13 in the top emission AMOLED display sub-panel 1 and providing reflected light for the normally-white mode reflective display sub-panel 2.

According to an embodiment of the present disclosure, forming the top emission AMOLED display sub-panel 1 further includes S11, forming a first substrate 11 before forming the first reflective electrode 12, wherein the first reflective electrode 12 is provided on the first substrate 11, S13, forming an organic light emitting layer 13 on the first reflective electrode 12, S14, forming a second electrode 14 on the organic light emitting layer 13, and S15, forming a package layer 15 on the second electrode 14.

Figure 10:
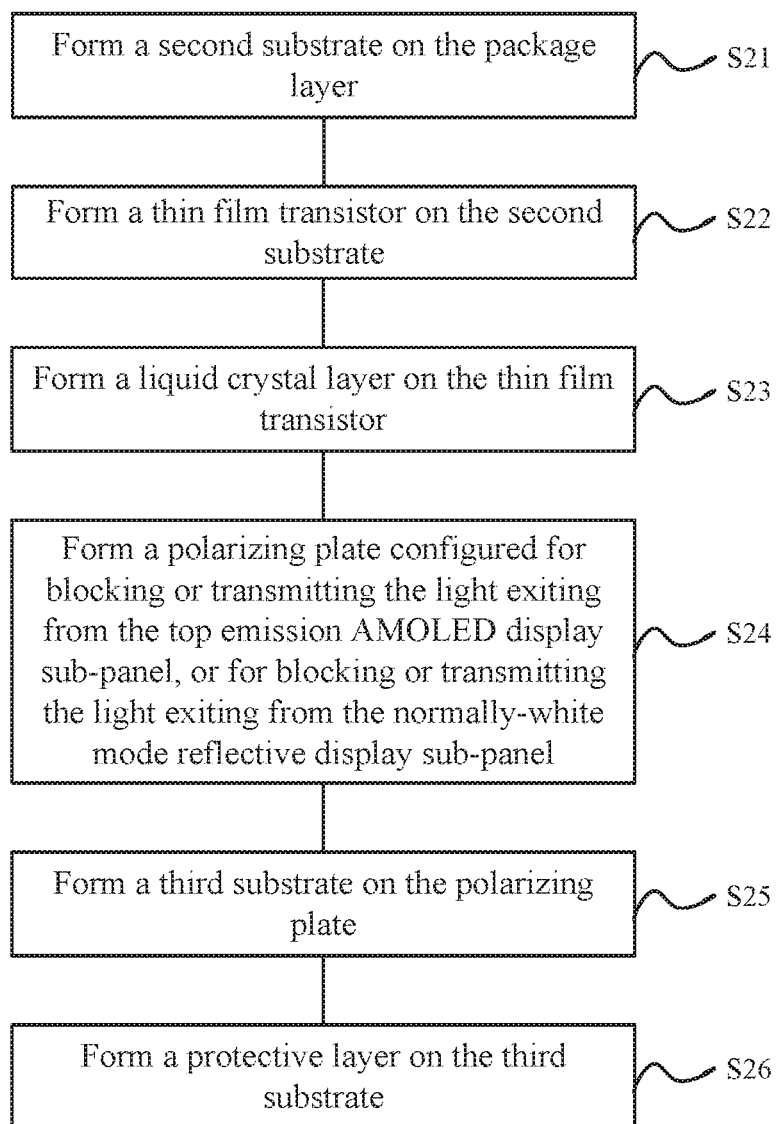
FIG. 10 shows a schematic flow chart of forming a normally-white mode reflective display sub-panel according to an embodiment of the present disclosure.

As shown in FIG. 10, according to an embodiment of the present disclosure, forming the normally-white mode reflective display sub-panel 2 on the top emission AMOLED display sub-panel 1 includes S24, forming a polarizing plate 24 configured for blocking or transmitting the light exiting from the top emission AMOLED display sub-panel 1, or blocking or transmitting the light exiting from the normally-white mode reflective display sub-panel 2.

According to an embodiment of the present disclosure, forming the normally-white mode reflective display sub-panel 2 on the top emission AMOLED display sub-panel 1 further includes S21, forming a second substrate 21 on the package layer 15, S22, forming a thin film transistor on the second substrate 21, and S23, forming a liquid crystal layer 22 on the thin film transistor. For example, several drops of liquid crystals are added on the thin film transistor and are then vacuum-aligned with the sub-panel on the liquid crystal layer to form a liquid crystal layer 22, wherein a sealant may be selected and coated on the periphery of the sub-panel on the liquid crystal layer, wherein, the polarizing plate 24 is formed after the liquid crystal layer 22 is formed.

According to an embodiment of the present disclosure, forming the normally-white mode reflective display sub-panel 2 on the top emission AMOLED display sub-panel 1 further includes forming an orientation layer on both sides of the liquid crystal layer 22 by mechanical friction or light irradiation. Since the process of forming the orientation layer by mechanical friction and light irradiation cannot be performed in a high-temperature environment, damages to the second substrate 21 can be avoided. Of course, in a case where the second substrate 21 can withstand a high temperature, the orientation layer may also be formed by selecting a plasma radiation or the like as necessary.

According to an embodiment of the present disclosure, forming the thin film transistor includes forming the thin film transistor in the temperature below 200° C.

Since the phase delay of the second substrate 21 needs to be set low to reduce its influence on the transmitted light and the substrate material having a low phase delay is low in temperature resistance and can withstand a temperature of about 200° C., when a thin film transistor (TFT) is formed on the second substrate 21, it is necessary to control the process temperature below 200° C. to avoid damages to the second substrate 21. Moreover, when the orientation layer of the liquid crystal layer 22 is fabricated, a low-temperature curing material having a curing temperature, for example of less than or equal to 200° C., may be selected to avoid damages to the second substrate 21 during curing.

According to an embodiment of the present disclosure, the thin film transistor produced at a low temperature may be a-Si TFT, an organic TFT, a low temperature oxide TFT, or a solution-type semiconductor TFT.

The method for fabricating the display panel according to an embodiment of the present disclosure further includes forming an adhesive layer 3 on the package layer 15 before forming the second substrate 21. The adhesive layer 3 may be configured for bonding the second substrate 21 and the package layer 15.

The method for fabricating the display panel according to the embodiment of the present disclosure further includes forming a touch sub-panel before forming the top emission AMOLED display sub-panel 1 or forming a touch sub-panel after forming the normally-white mode reflective display sub-panel 2, wherein if the touch sub-panel is formed before the top emission AMOLED display sub-panel 1 is formed, forming the normally-white mode reflective display sub-panel 2 further includes S25, forming a third substrate 25 on the polarizing plate 24, and S26, forming a protective layer on the third substrate 25.

According to an embodiment of the present disclosure, forming the normally-white mode reflective display sub-panel 2 further includes forming a flat layer 26 on the second substrate 21 before forming the thin film transistor.

According to an embodiment of the present disclosure, forming the normally-white mode reflective display sub-panel 2 further includes forming a barrier layer 27 on the package layer 15 before forming the second substrate 21.

According to an embodiment of the present disclosure, the forming process employed in the above-described processes may include, for example, patterning processes such as deposition, sputtering, and etching.

The technical solution of the present disclosure has been described in detail with reference to the accompanying drawings. In the prior art, it is necessary to turn over the display when viewing the reflective screen and the AMOLED screen, resulting in complex operations, and easily damaging the other side when viewing one side. According to the technical solution of the present application, by fabricating the normally-white mode reflective display sub-panel on the top emission AMOLED display sub-panel, it is possible to switch the reflective sub-panel on one operation interface to achieve a good display effect under strong light, or switch the top emission AMOLED display sub-panel to achieve viewing color content. The display panel and the fabricating method thereof and the corresponding display device according to the embodiment of the present disclosure are easy to operate and simple in structure.

It is to be noted that in the drawings, the dimensions of the layers and regions may be exaggerated for clarity of illustration. Moreover, it will be appreciated that when an element or layer is referred to as being "on/above" another element or layer, it may be directly on/above the other element, or there may be an intermediate layer. In addition, it will be appreciated that when an element or layer is referred to as being "under/below" another element or layer, it may be directly under/below the other element, or there may be more than one intermediate layer or element. In addition, it will also be appreciated that when a layer or element is referred to as being "between" two layers or two elements, it may be a unique layer between the two layers or two elements, or there may be more than one intermediate layer or component. Similar reference numerals refer to similar elements throughout.

In the present disclosure, the terms "first", "second", and "third" are for descriptive purposes only and are not to be construed as indicating or implying relative importance. The term "plural" means two or more, unless otherwise expressly stated.

The foregoing is merely about the specific embodiments of the present disclosure, but the scope of the present disclosure is not limited thereto, and any person skilled in the art can easily think of variations or substitutions within the technical scope of the present disclosure, which shall be encompassed within the scope of the present disclosure. Accordingly, the scope of protection of the present disclosure should be based on the scope of protection of the claims.

What is claimed is:

1. A display panel, comprising:
    a top emission AMOLED display sub-panel which comprises:
        a first reflective electrode;
        a first substrate on which the first reflective electrode is provided;
        an organic light emitting layer being provided on the first reflective electrode;
        a second electrode provided on the organic light emitting layer; and
    a package layer provided on the second electrode;
    a normally-white mode reflective display sub-panel provided on the top emission AMOLED display sub-panel, wherein the normally-white mode reflective display sub-panel comprises:
        a polarizing plate,
        a second substrate provided on the package layer;
        a thin film transistor provided on the second substrate;

a liquid crystal layer provided on the thin film transistor, wherein the polarizing plate is provided on the liquid crystal layer; and a flat layer provided between the second substrate and the thin film transistor; and a switching element configured to turn on the top emission AMOLED display sub-panel and turn off the normally-white mode reflective display sub-panel according to a received first instruction, and turn on the normally-white mode reflective display sub-panel and turn off the top emission AMOLED display sub-panel according to a received second instruction.

2. The display panel according to claim 1, wherein a thickness of the organic light emitting layer is smaller than a predetermined thickness.

3. The display panel according to claim 1, wherein a phase delay of the second substrate is smaller than a preset value.

4. The display panel according to claim 3, further comprising:

an adhesive layer provided between the second substrate and the package layer.

5. The display panel according to claim 4, further comprising:

a touch sub-panel provided below the top emission AMOLED display sub-panel or provided above the normally-white mode reflective display sub-panel, wherein, if the touch sub-panel is provided below the top emission AMOLED display sub-panel, the normally-white mode reflective display sub-panel further comprises:

a third substrate provided on the polarizing plate; and a protective layer provided on the third substrate.

6. The display panel according to claim 1, wherein the normally-white mode reflective display sub-panel further comprises:

a barrier layer provided below the second substrate.

7. The display panel according to claim 6, wherein a sum of thicknesses of the flat layer, the second substrate, the barrier layer, the package layer, a second electrode and an organic light emitting layer is between 35 and 60 micrometers ($\mu$m).

8. The display panel according to claim 7, wherein the normally-white mode reflective display sub-panel further comprises:

a color film layer provided between the liquid crystal layer and the polarizing plate.

9. A display device comprising a display panel according to claim 1.

* * * * *